(12) United States Patent
Seong et al.

(10) Patent No.: US 11,632,094 B2
(45) Date of Patent: Apr. 18, 2023

(54) RADIO FREQUENCY SPLITTER AND FRONT-END MODULE

(71) Applicant: Samsung Electro-Mechanics Co., Ltd., Suwon-si (KR)

(72) Inventors: Nack Gyun Seong, Suwon-si (KR); Ju Young Park, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 132 days.

(21) Appl. No.: 16/930,396

(22) Filed: Jul. 16, 2020

(65) Prior Publication Data

US 2021/0320640 A1    Oct. 14, 2021

(30) Foreign Application Priority Data

Apr. 13, 2020   (KR) .................. 10-2020-0044727

(51) Int. Cl.
| | | |
|---|---|---|
| *H03H 7/48* | (2006.01) | |
| *H03F 3/60* | (2006.01) | |
| *H01P 5/12* | (2006.01) | |
| *H04B 1/04* | (2006.01) | |
| *H03F 3/24* | (2006.01) | |

(52) U.S. Cl.
CPC ............ *H03H 7/482* (2013.01); *H01P 5/12* (2013.01); *H03F 3/24* (2013.01); *H03F 3/602* (2013.01); *H04B 1/04* (2013.01); *H03F 2200/294* (2013.01); *H03F 2200/451* (2013.01); *H04B 2001/0408* (2013.01)

(58) Field of Classification Search
CPC .. H03H 7/482; H03H 7/48; H01P 5/12; H03F 3/24; H03F 3/602; H03F 2200/294; H03F 2200/451; H04B 1/04; H04B 2001/0408
See application file for complete search history.

(56) References Cited

U.S. PATENT DOCUMENTS 5,754,082 A *  5/1998  Swanson ................ H03H 7/487
                                                       333/100
6,323,742 B1 * 11/2001  Ke ............................ H01P 1/10
                                                       333/101

(Continued)

FOREIGN PATENT DOCUMENTS

| JP | 2006-203638 A | 8/2006 |
|---|---|---|
| KR | 10-2015-0065482 A | 6/2015 |

*Primary Examiner* — Hafizur Rahman
*Assistant Examiner* — Kimberly E Glenn
(74) *Attorney, Agent, or Firm* — NSIP Law

(57) ABSTRACT

A radio-frequency (RF) splitter is provided. The RF splitter includes a common branch node configured to transfer an RF signal, input from an input port, to at least one of first and second output ports, first and second branch nodes electrically connected between the common branch node and the first and second output ports, first and second series switches configured to control switching operations to electrically connect the common branch node and the first and second branch nodes to each other, first and second inductors electrically connected between the common branch node and the first and second branch nodes, a resistor electrically connected between the first and second branch nodes, and first and second shunt switches configured to control switching operations to electrically connect the first and second branch nodes and the resistor to each other.

16 Claims, 12 Drawing Sheets

(56) References Cited

U.S. PATENT DOCUMENTS

| | | | |
|---|---|---|---|
| 8,401,505 B1* | 3/2013 | Bidichandani | H04B 7/24 |
| | | | 455/67.11 |
| 2010/0295629 A1* | 11/2010 | Klemens | H03F 1/56 |
| | | | 333/126 |
| 2015/0162972 A1 | 6/2015 | Song et al. | |
| 2016/0112027 A1* | 4/2016 | Blair | H01L 23/373 |
| | | | 333/125 |
| 2019/0214961 A1* | 7/2019 | Hosagavi Puttaraju | |
| | | | H03H 7/461 |

* cited by examiner

RADIO FREQUENCY SPLITTER AND FRONT-END MODULE

CROSS-REFERENCE TO RELATED APPLICATION(S)

This application claims the benefit under 35 USC 119(a) of Korean Patent Application No. 10-2020-0044727 filed on Apr. 13, 2020 in the Korean Intellectual Property Office, the entire disclosure of which is incorporated herein by reference for all purposes.

BACKGROUND

1. Field

The following description relates to a radio-frequency (RF) splitter and a front-end module.

2. Description of Related Art

To increase the communications speed of wireless local area networks (WLAN), communications technology having a wide bandwidth and a high throughput rate and communications protocol standardization are continuously being performed. Standardization of Wi-Fi6 (802.11ax), a next-generation standard, to which technologies such as Orthogonal frequency-division multiple access (OFDMA), multi user-multiple input multiple output (MU-MIMO), and the like, for high-density/high-efficiency WLAN are applied, is currently being implemented to achieve not only an increase in communications speed, but also further improved communications performance in indoor and outdoor environments in which access points (AP) and mobile terminals are crowded. In 2018, the US Federal Communications Commission (FCC) has additionally allocated the 6 GHz band (5.925 to 7.125 GHz) for unlicensed use, so that a bandwidth of 1200 MHz could be secured to support higher communication speeds and to provide various W-Fi 6 services.

Additionally, Long Term Evolution (LTE) licensed assisted access (LTE-LAA) carrier aggregation (CA) is currently being utilized for the implementation of smooth service as 5G mobile communication services have been commercialized based on high-speed data transfer. LTE-LAA CA is a technology in which an LTE licensed band and an unlicensed band, including a Wi-Fi frequency, may be combined to transfer data in a wider band. Existing CA technology may successfully implement a higher communications speed, but the higher communications speed may not satisfy a communications speed necessary for 5G mobile communications.

Accordingly, an LTE frequency band of 20 MHz and a Wi-Fi frequency band of 60 MHz, an unlicensed band, were combined to achieve a transfer rate about 10 times higher than a transfer rate of existing LTE, which satisfied the communications speed necessary for 5G mobile communications. Similarly, transmitting and receiving ends of a mobile device, in which LTE-LAA and Wi-Fi wireless environments coexist while satisfying the next-generation Wi-Fi standard, should be provided with a front-end module, having wide band characteristics, that performs a co-existence operation and covers a band of 60 GHz. Additionally, since a low-noise amplifier (LNA) disposed on a reception path may play an important role to affect overall performance of a receiver, low-noise characteristics, a high voltage gain, and linear characteristics may be beneficial.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a radio-frequency (RF) splitter includes a common branch node configured to transfer an RF signal, input from an input port, to at least one of a first output port and a second output port; a first branch node electrically connected between the common branch node and the first output port; a second branch node electrically connected between the common branch node and the second output port, and electrically connected to the first branch node; a first series switch configured to control a switching operation to electrically connect the common branch node and the first branch node to each other; a second series switch configured to control a switching operation to electrically connect the common branch node and the second branch node to each other; a first inductor electrically connected between the common branch node and the first branch node; a second inductor electrically connected between the common branch node and the second branch node; a resistor electrically connected between the first branch node and the second branch node; a first shunt switch configured to control a switching operation to electrically connect the first branch node and the resistor to each other; and a second shunt switch configured to control a switching operation to electrically connect the second branch node and the resistor to each other.

The first series switch and the first shunt switch may be configured to operate in an ON state when the RF splitter operates in a first mode and a third mode, and may be configured to operate in an OFF state when the RF splitter operates in a second mode, and the second series switch and the second shunt switch may be configured to operate in an ON state when the RF splitter operates in the second mode and the third mode, and may be configured to operate in an OFF state when the RF splitter operates in the first mode.

The RF splitter may include a third shunt switch configured to control a switching operation to electrically connect a ground and a third branch node between the first branch node and the resistor to each other; and a fourth shunt switch configured to control a switching operation to electrically connect the ground and a fourth branch node between the second branch node and the resistor to each other.

The RF splitter may include a first capacitor electrically connected between a first end of the first inductor and the ground; a second capacitor electrically connected between a first end of the second inductor and the ground; a third capacitor electrically connected between a second end of the first inductor and the ground; and a fourth capacitor electrically connected between a second end of the second inductor and the ground.

The first capacitor, the second capacitor, the third capacitor, and the fourth capacitor, and the first inductor and the second inductor may have impedance such that the RF signal of a fundamental frequency of a band of 5.1 GHz to 7.2 GHz, is transferred to at least one of the first output port and the second output port.

The RF splitter may further include a first capacitor electrically connected between the first inductor and a ground; and a second capacitor electrically connected between the second inductor and the ground, wherein the first inductor may be connected in series between the common branch node and the first branch node, and the second inductor may be connected in series between the common branch node and the second branch node.

The resistor may have a first resistance value when the RF splitter transfers the RF signal to only one of the first output port and the second output port, and may have a second resistance value, different from the first resistance value, when the RF splitter transfers the RF signal to the first output port and the second output port.

In a general aspect, a front-end module includes a reception amplifier configured to amplify a received radio-frequency (RF) signal; and an RF splitter electrically connected between an output terminal of the reception amplifier and first and second reception ports, wherein the RF splitter includes a common branch node configured to transfer one of a received RF signal amplified by the reception amplifier, and a received RF signal that bypasses the reception amplifier, to at least one of the first reception port and the second reception port; a first branch node electrically connected between the common branch node and the first reception port; a second branch node electrically connected between the common branch node and the second reception port, and electrically connected to the first branch node; a first series switch configured to control a switching operation to electrically connect the common branch node and the first branch node to each other; a second series switch configured to control a switching operation to electrically connect the common branch node and the second branch node to each other; a first inductor electrically connected between the common branch node and the first branch node; a second inductor electrically connected between the common branch node and the second branch node; a resistor electrically connected between the first branch node and the second branch node; a first shunt switch configured to control a switching operation to electrically connect the first branch node and the resistor to each other; and a second shunt switch configured to control a switching operation to electrically connect the second branch node and the resistor to each other.

The front-end module may include a third shunt switch configured to control a switching operation to electrically connect a ground and a third branch node between the first branch node and the resistor to each other; and a fourth shunt switch configured to control a switching operation to electrically connect a ground and a fourth branch node between the second branch node and the resistor to each other.

The front-end module may further include a controller configured to operate in a selected one of a first mode, a second mode, and a third mode to control the first series switch and the second series switch, and the first shunt switch, the second shunt switch, the third shunt switch, and the fourth shunt switch, wherein the controller, when configured to operate in the first mode, controls the first series switch and the first and fourth shunt switches in an ON state, and controls the second series switch and the second and third shunt switches in an OFF state, the controller, when configured to operate in the second mode, controls the second series switch and the second and third shunt switches in an ON state, and controls the first series switch and the first and fourth shunt switches in an OFF state, and the controller, when configured to operate in the third mode, controls the first and second series switches and the first and second shunt switches in an ON state and controls the third and fourth shunt switches in an OFF state.

The resistor may have a selected one of a first resistance value and a second resistance value, wherein the first resistance value may be different from the second resistance value, and the controller may be configured to control the resistor such that the resistor has the first resistance value when the controller operates in the first mode and the second mode, and may have the second resistance value when the controller operates in the third mode.

The RF splitter may transfer a received RF signal of a first communication protocol to the first reception port when the controller operates in the first mode and may transfer a received RF signal of a second communication protocol, different from the first communication protocol, to the second reception port when the controller operates in the second mode, and at least a portion of a frequency band of the first communication protocol, and at least a portion of a frequency band of the second communication protocol overlap each other.

The front-end module may further include a first branch switch electrically connected between the first reception port and the first branch node; and a second branch node electrically connected between an input terminal of the reception amplifier and an antenna port, wherein the first branch switch and the second branch switch are configured to transfer the received RF signal from the antenna port to the first reception port or the second reception port through the RF splitter when the first branch switch and the second branch switch operate in a receiving mode, and to transfer the received RF signal from the first reception port to the antenna port by bypassing the RF splitter when the first branch switch and the second branch switch operate in a transmitting mode.

The front-end module may include a transmission amplifier input port configured to be electrically connected to the first branch switch, and to be electrically connected to an input terminal of an external transmission amplifier; and a transmission amplifier output port configured to be electrically connected to the second branch switch, and to be electrically connected to an output terminal of the transmission amplifier.

The reception amplifier may include a first amplifier transistor and a second amplifier transistor connected in a cascode structure; and an intermediate inductor electrically connected in series between the first amplifier transistor and second amplifier transistor.

The reception amplifier may include a shunt output inductor electrically connected in series between an output terminal of a first amplifier transistor and a power source; a series output capacitor electrically connected in series between the output terminal of the first amplifier transistor and the RF splitter; a shunt output capacitor electrically connected in series between the output terminal of the first amplifier transistor and the RF splitter, and a ground; and a series output inductor electrically connected in series between the output terminal of the first amplifier transistor and the RF splitter.

In a general aspect, a radio-frequency (RF) module includes a first reception port; a second reception port; an RF splitter configured to receive a first RF signal and a second RF signal; wherein the RF splitter is configured to: transmit the first RF signal to one of the first reception port and the second reception port in a first mode; transmit the second RF signal to another of the first reception port and the second reception port in a second mode, and transmit the first RF signal and the second RF signal to the first reception port and the second reception port in a third mode.

The first RF signal may be of a first communication protocol, and the second RF signal is of a second communication protocol that is different from the first communication protocol.

Other features and aspects will be apparent from the following detailed description, the drawings, and the claims.

Figure 1A:
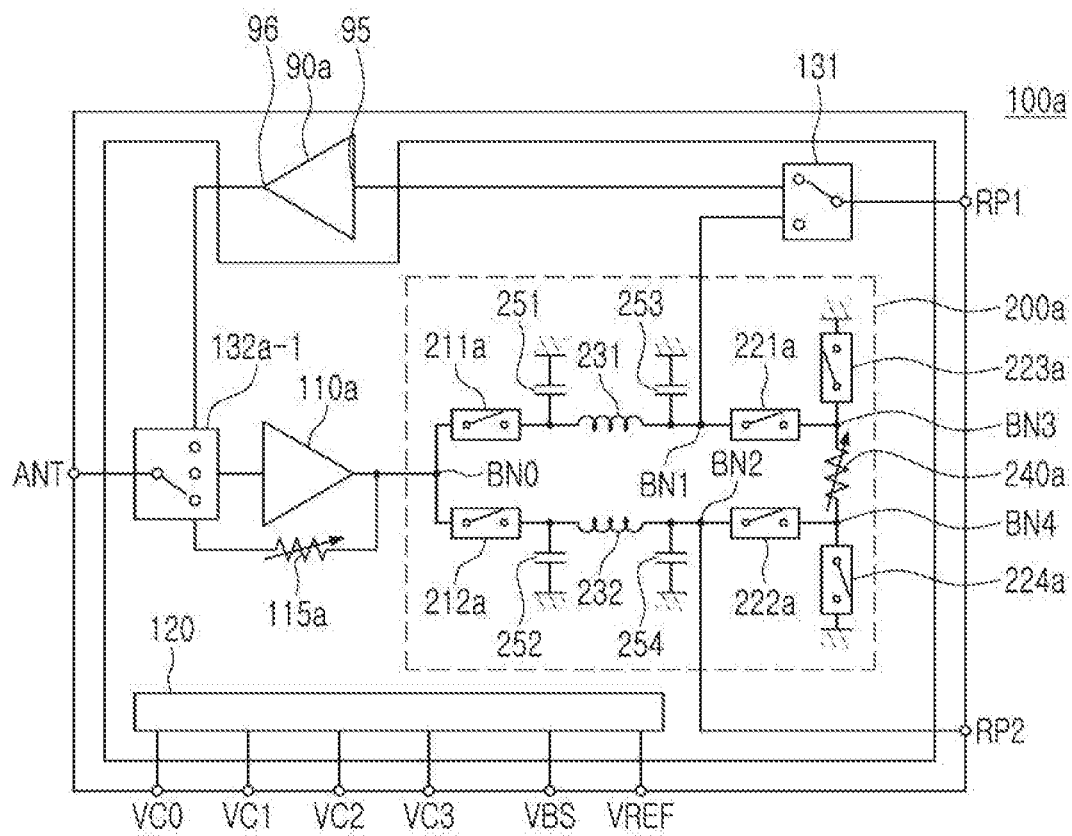
FIG. 1A illustrates a radio-frequency (RF) splitter and a front-end module, according to one or more embodiments.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

FIG. 1A illustrates a radio-frequency (RF) splitter and a front-end module, according to one or more embodiments.

Referring to FIG. 1A, a front-end module 100a, according to one or more embodiments, may include a reception amplifier 110a and a radio-frequency (RF) splitter 200a. In an example, all circuits included in the front-end module 100a may be configured as a single integrated circuit (IC), and the RF splitter 200a may be embedded in the front-end module 100a.

The reception amplifier 110a may amplify a received radio-frequency (RF) signal. The received RF signal may be remotely received by an antenna electrically connected to an antenna port ANT, and the reception amplifier 110a may amplify the received RF signal while suppressing an increase in noise due to amplification.

The received RF signal may be transferred to a first reception port RP1 and/or a second reception port RP2 through the RF splitter 200a in a state in which the received RF signal is amplified by the reception amplifier 110a, or bypasses the reception amplifier 110a through a bypass path 115a.

The RF splitter 200a may be electrically connected between an output terminal of the reception amplifier 110a and the first and second reception ports RP1 and RP2, and may transfer the received RF signal to the first and second reception ports RP1 and RP2 at the same time.

For example, the received RF signal may simultaneously include a first RF signal of a first communication standard (for example, Wi-Fi) and a second RF signal of a second communication standard (for example, LTE Licensed Assisted Access (LTE-LAA)). The first and second RF signals may be simultaneously transmitted to both the first and second receiving ports RP1 and RP2.

Accordingly, a first communication modem electrically connected to the first reception port RP1, and a second communication modem electrically connected to the second reception port RP2, may process the first and second RF signals at a speed that is two or more times higher than in a time division duplexing (TDD) manner to obtain received information.

The RF splitter 200a may have a first transmission impedance between an output terminal of the reception amplifier 110a and the first reception port RP1, and a second transmission impedance between an output terminal of the reception amplifier 110a and the second reception port RP2. When the first and second transmission impedances match impedances corresponding to frequencies of the first and second RF signals included in the received RF signal, the first and second RF signals may be simultaneously transferred to the first and second reception ports RP1 and RP2.

For example, the RF splitter 200a may simultaneously transfer the first and second RF signals, included in the received RF signal, to both the respective first and second reception ports RP1 and RP2 using only passive elements.

First communication of a first communication protocol, and second communication of a second communication protocol may be individually performed depending on an environment of each of the first and second communications, or an environment of an electronic device in which the front-end module 100a is disposed.

The first and second communication modems may be temporarily switched to operate in a manner in which the first and second communications are individually performed, such as, for example, a TDD manner. In this example, the first RF signal, transferred to the second communication modem when the first communication modem receives the first RF signal, may deteriorate reception sensitivity of the second RF signal of the second communication modem or performance of the front-end module 100a, and the second RF signal, transferred to the first communication modem when the second communication modem receives the second RF signal, may deteriorate reception sensitivity of the first RF signal of the first communication modem or the performance of the front-end module 100a.

Therefore, the RF splitter 200a may not only simultaneously transfer the first and second RF signals, included in the received RF signal to both the first and second reception ports RP1 and RP2, but the RF splitter 200a may also selectively transfer the first and second RF signals included in the received RF signal, to a corresponding one of the first and second reception ports RP1 and RP2.

Referring to FIG. 1A, the RF splitter 200a may include a common branch node BN0, a first branch node BN1, a second branch node BN2, a first series switch 211a, a second series switch 212a, a first inductor 231, a second inductor 232, a resistor 240a, a first shunt switch 221a, and a second shunt switch 222a.

The common branch node BN0 may be configured to transfer a received RF signal that.0 is amplified by the reception amplifier 110a, or transfer a received RF signal that bypasses the reception amplifier 110a, to at least one of the first and second reception ports RP1 and RP2.

The first branch node BN1 may be electrically connected between the common branch node BN0 and the first reception port RP1, and the second branch node BN2 may be electrically connected between the common branch node BN0 and the second reception port RP2, and may be electrically connected to the first branch node BN1.

The first inductor 231 may be electrically connected in series between the common branch node BN0 and the first branch node BN1, the second inductor 232 may be electrically connected in series between the common branch node BN0 and the second branch node BN2, the resistor 240a may be electrically connected in series between the first and second branch nodes BN1 and BN2.

In an example, the first and second inductors 231 and 232 and the resistor 240a may be passive elements. A combination of the first inductor 231 and the resistor 240a may constitute at least a portion of a first transmission impedance between the output terminal of the reception amplifier 110a and the first reception port RP1, and a combination of the second inductor 232 and resistor 240a may constitute at least a portion of a second transmission impedance between the output terminal of the reception amplifier 110a and the second reception port RP2. When the first and second transmission impedances match impedances corresponding to the frequencies of the first and second RF signals included in the received RF signal, the first and second RF signals may be simultaneously transferred to both the first and second reception ports RP1 and RP2.

The first series switch 211a may be configured to control switching operations which electrically connect or disconnect the common branch node BN0 and the first branch node BN1 to or from each other, and the second series switch 212a may be configured to control switching operations which electrically connect or disconnect a common branch node BN0 and the second branch node BN2 to or from each other.

The first shunt switch 221a may be configured to control or perform switching operations which electrically connect or disconnect the first branch node BN1 and the resistor 240a to or from each other, and the second shunt switch 222a may be configured to control switching operations which electrically connect or disconnect the second branch node BN2 and resistor 240a to and from each other.

When the second series switch 212a separates the common branch node BN0 and the second branch node BN2 from each other and the second shunt switch 222a separates the second branch node BN2 and the resistor 240a from each other, the received RF signal may be transmitted only to the first reception port RP1, rather than the second reception port RP2. In this example, the first transmission impedance between the output terminal of the reception amplifier 110a and the first reception port RP1 may not be significantly affected by the separation operations of the second series switch 212a and the second shunt switch 222a. Accordingly, the received RF signal may be efficiently transferred to the first reception port RP1, generation of a reflected wave of the received RF signal may be suppressed, the reflected wave of the received RF signal may be prevented from being transferred to the second reception port RP2 and the output terminal of the reception amplifier 110a, and a deterioration in performance of a circuit, connected to the second reception port RP2, or the reception amplifier 110a may be prevented.

When the first series switch 211a blocks a portion between the common branch node BN0 and the first branch node BN1, and the first shunt switch 221a blocks a portion between the first branch node BN1 and the resistor 240a, the received RF signal may be transmitted only to the second reception port RP2, rather than first reception port RP1. In this example, the second transmission impedance between the output terminal of the reception amplifier 110a and the second reception port RP2 may not be significantly affected by the separation operations of the first series switch 211a and the first shunt switch 221a. Accordingly, the received RF signal may be efficiently transferred to the second reception port RP2, generation of a reflected wave of the received RF signal may be suppressed, the reflected wave of the received RF signal may be prevented from being transferred to the first reception port RP1 and the output terminal of the reception amplifier 110a may be prevented, and a deterioration in performance of a circuit, connected to the first reception port RP1, or the reception amplifier 110a may be prevented.

For example, the RF splitter 200a and the front-end module 100a may support efficient and stable reception of a received RF signal in both a first example, in which the first and second communication modems operate at the same time, and a second example in which the first and second communication modems operate in a time division duplexing manner, and may prevent performance deterioration resulting from the reflected wave of the received RF signal.

Referring to FIG. 1A, the RF splitter 200a may further include a third shunt switch 223a and a fourth shunt switch 224a.

The third shunt switch 223a may be configured to control or perform switching operations which electrically connect or disconnect a ground and the third branch node BN3 between the first branch node BN1 and the resistor 240a to or from each other, and the fourth shunt switch 224a may be configured to control or perform switching operations which electrically connect or disconnect a ground and the fourth branch node BN4 between the second branch node BN2 and the resistor 240a to or from each other.

Accordingly, when the received RF signal is transferred to only the first reception port RP1 rather than the second reception port RP2, or to only the second reception port RP2 rather than the first reception port RP1, the resistor 240a may more efficiently suppress the generation of the reflected wave of the received RF signal and may more efficiently suppress the performance of the reception amplifier 110a from being deteriorated when the reflected wave of the received RF signal is transferred to the reception amplifier 110a.

Referring to FIG. 1A, the RF splitter 200a may further include at least one of first, second, third, and fourth respective capacitors 251, 252, 253, and 254.

The first capacitor 251 may be electrically connected between one end of the first inductor 231 and a ground, the second capacitor 252 may be electrically connected between one end of the second inductor 232 and a ground, the third capacitor 253 may be electrically connected between the other end of the first inductor 231 and the ground, and the fourth capacitor 254 may be electrically connected between the other end of the second inductor 232 and the ground.

Capacitances of the first, second, third, and fourth capacitors 251, 252, 253, and 254 and inductances of the first and second inductors 231 and 232 may provide a resonant frequency to the RF splitter 200a. The RF splitter 200a may have a wider bandwidth based on the provided resonant frequency.

For example, the first, second, third, and fourth capacitors 251, 252, 253, and 254 and the first and second inductors 231 and 232 may have impedance such that an RF signal of a fundamental frequency, belonging to a band of 5.1 GHz to 7.2 GHz, is transferred to at least one of the first and second reception ports RP1 and RP2. Accordingly, the RF splitter 200a may have a wide bandwidth stably covering a frequency band corresponding to W-Fi and a frequency band corresponding to LTE-LAA.

Referring to FIG. 1A, the front-end module 100a may further include a controller 120.

The controller 120 may control the first and second series switches 211a and 212a and the first, second, third, and fourth shunt switches 221a, 222a, 223a, and 224a. When operating in the first mode, the controller 120 may operate such that the received RF signal is transferred to only the first reception port RP1, rather than the second reception port RP2. When operating in the second mode, the controller 120 may operate such that the received RF signal is transferred to only the second reception port RP2, rather than the first reception port RP1. When operating in a third mode, the controller may operate such that the received RF signal is simultaneously transferred to both the first and second reception ports RP1 and RP2.

In a non-limiting example, the first and second series switches 211a and 212a and the first, second, third, and fourth shunt switches 221a, 222a, 223a, and 224a may each include a semiconductor transistor. The controller 120 may output a control voltage input to a gate terminal of the semiconductor transistor. The first and second series switches 211a and 212a and the first, second, third, and fourth shunt switches 221a, 222a, 223a and 224a may electrically connect a drain terminal and a source terminal of the semiconductor transistor to each other when the control voltage is high, and may separate the drain terminal and the source terminal of the semiconductor transistor from each other when the control voltage is low.

For example, the controller 120 may receive mode control voltages VC0, VC1, VC2, and VC3, a bias voltage VBS, and power source VREF from an external device (for example, a communication modem or a PMIC as non-limiting examples) of the front-end module 100a VREF, may control the first and second series switches 211a and 212a and the first, second, third, and fourth shunt switches 221a, 222a, 223a, and 224a based on mode control voltages VC0, VC1, VC2, and VC3, may use a bias voltage VBS and the power source VREF, and may provide the bias voltage VBS and the power source VREF to the reception amplifier 110a.

In an example, the RF splitter 200a may transfer a received RF signal of a first communication protocol (for example, Wi-Fi) to the first reception port RP1 when the controller 120 operates in the first mode, may transfer a received RF signal of a second communication protocol (for example, LTE-LAA), different from the first communication protocol, when the controller 120 operates in the second mode, and may simultaneously transfer received RF signals of the first and second communication protocols to the first and second reception ports RP1 and RP2 when the controller 120 operates in the third mode. In this example, at least a portion of a frequency band of the first communication protocol and at least a portion of a frequency band of the second communication protocol may overlap each other.

In an example, the resistor 240a may be configured to have a selected one of first and second resistance values, different from each other, depending on a design. When operating in the first and second modes, the controller 120 may control the resistor 240a such that the resistor 240a has the first resistance value. When operating in the third mode, the controller 120 may control the resistor 240a such that the resistor 240a has the second resistance value. Accordingly, the first transmission impedance between the output terminal of the reception amplifier 110a and the first reception port RP1, and the second transmission impedance between the output terminal of the reception amplifier 110a and the second reception port RP1 may be further optimized for the mode of the controller 120, and thus, the generation of reflected waves of the received RF signal may be further suppressed.

Referring to FIG. 1A, the front-end module 100a may further include a first branch switch 131 and a second branch switch 132a-1.

The first branch switch 131 may be electrically connected between the first reception port RP1 and the first branch node BN1, and the second branch switch 132a-1 may be electrically connected between an input terminal of the reception amplifier 110a and the antenna port ANT.

Accordingly, a circuit electrically connected to the first reception port RP1 may not only receive the received RF signal through the RF splitter 200a, but also bypass the RF splitter 200a to transfer the RF signal to an antenna or to receive the RF signal from the antenna. When the RF signal is transferred by bypassing the RF splitter 200a, the first and second branch switches 131 and 132a-1 may inhibit the reflected wave of the RF signal from being transferred to the RF splitter 200a.

For example, the first and second branch switches 131 and 132a-1 may be configured to transfer the received RF signal to the first reception port RP1 or the second reception port RP2 from the antenna port ANT through the RF splitter when operating in a receiving mode, and to transfer the received RF signal to the antenna port ANT from the first reception port RP1 by bypassing the RF splitter 200a when operating in a transmitting mode. For example, the first reception port RP1 may be used as a transmission path of not only the received RF signal but also the transferred RF signal.

In an example, the front-end module 100a may include a transmission amplifier input port 95, configured to be electrically connected to the first branch switch 131 and electrically connected to an input terminal of an external transmission amplifier 90a, and a transmission amplifier output port 96 configured to be electrically connected to the second branch switch 132a-1 and electrically connected to an output terminal of the transmission amplifier 90a.

In an example, the front-end module 100a may provide the transmission path of the transferred RF signal, but may not include the transmission amplifier 90a.

Since the transmission amplifier 90a amplifies a relatively high power transmission RF signal, the transmission amplifier 90a may be separated from the transmission amplifier 110a and the radio-frequency splitter 200a of the front-end module 100a to be more advantageously implemented to enhance energy efficiency.

Figure 1B:
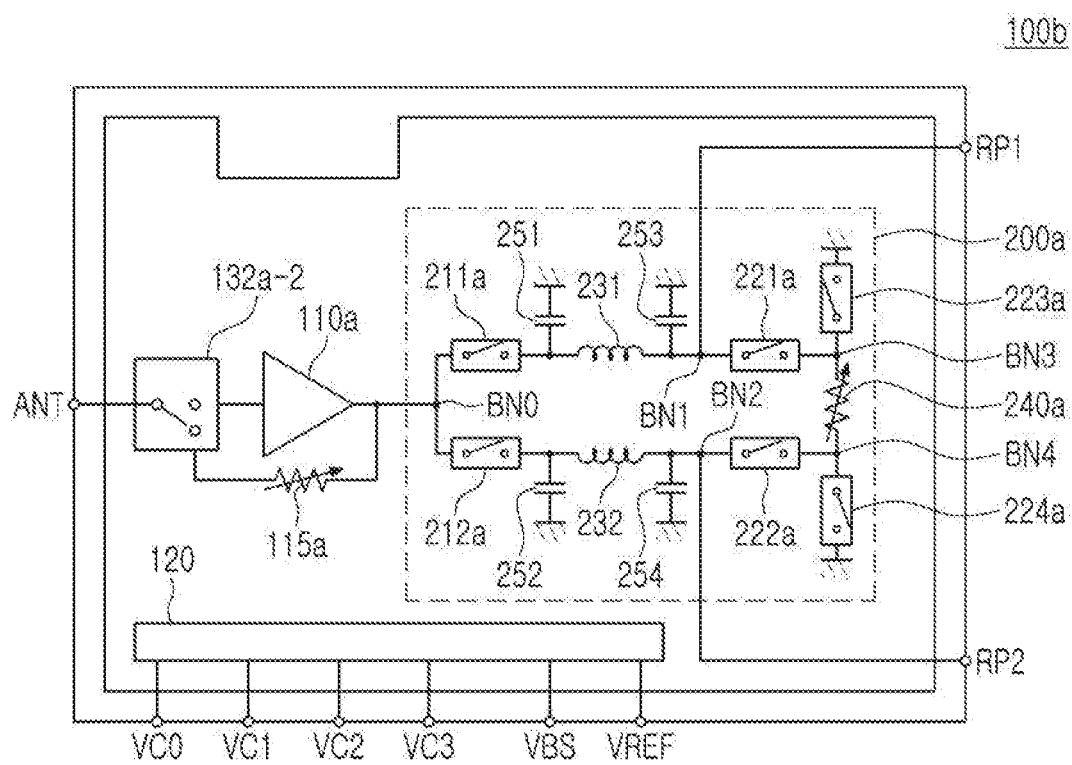
FIG. 1B illustrates a structure in which a transmitter is omitted in a radio-frequency (RF) splitter and a front-end module according, according to one or more embodiments.

FIG. 1B illustrates a structure in which a transmitter is omitted in a radio-frequency (RF) splitter, and a front-end module, in accordance with one or more embodiments.

Referring to FIG. 1B, a front-end module 100b according to an example may have a structure in which the first branch switch 131, illustrated in FIG. 1A, is omitted and may include a second branch switch 132a-2 having a reduced branch path, or a reduced number of branch paths.

Figure 2A:
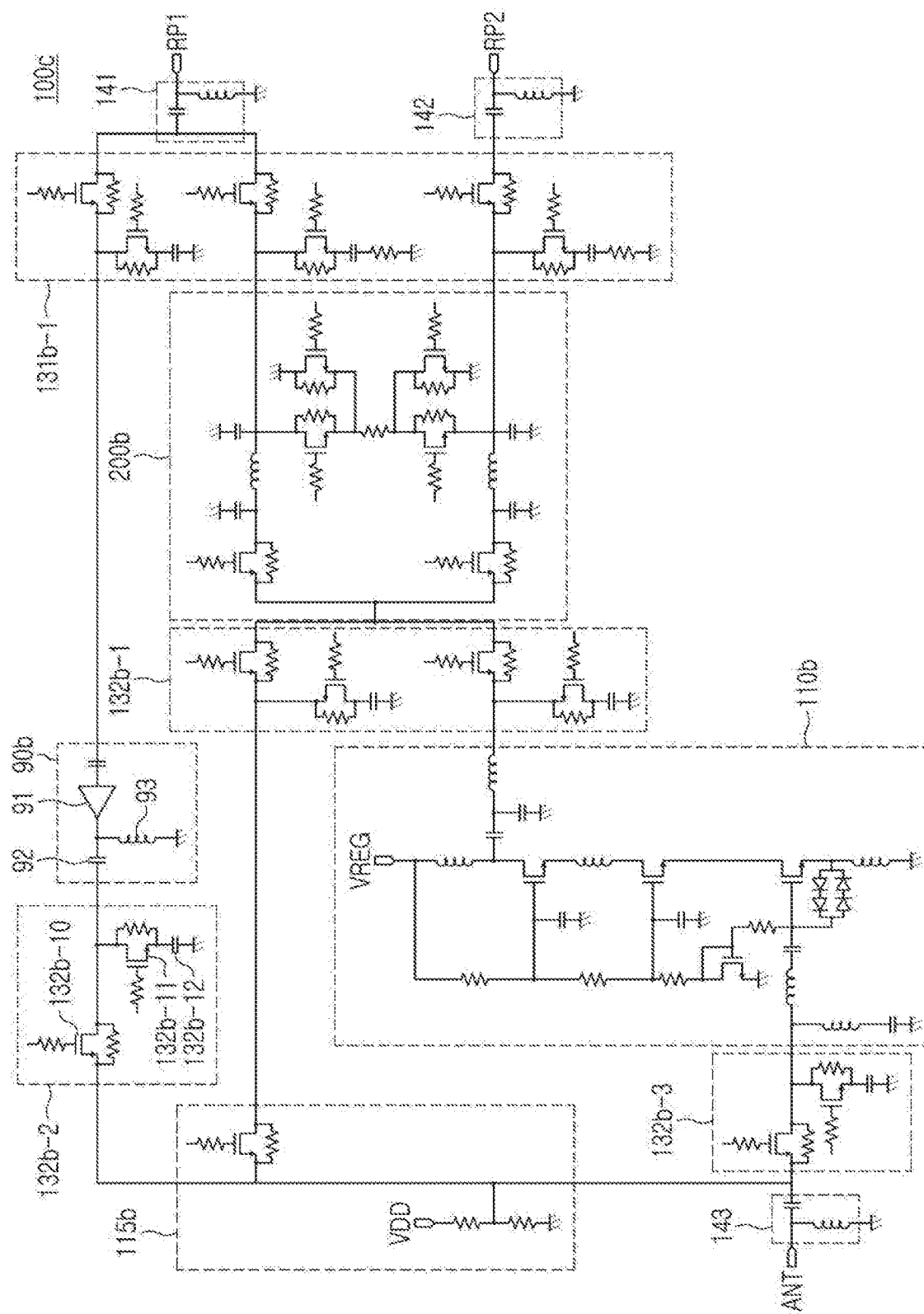
FIG. 2A is a circuit diagram of a radio-frequency (RF) splitter and a front-end module, according to one or more embodiments.

FIG. 2A is a circuit diagram of a radio-frequency (RF) splitter and a front-end module according, in accordance with one or more embodiments.

Referring to FIG. 2A, a front-end module 100c according to an example may include a reception amplifier 110b and a radio-frequency (RF) splitter 200b, and may further include at least one of a bypass path 115b, a first branch switch 131b-1, second branch switches 132b-1, 132b-2, and 132b-3, a matching terminal 141 of a first reception port RP1, a matching terminal 142 of a second reception port RP2, and a matching terminal 143 of an antenna port ANT.

The second branch switch 132b-2 may include a series switch 132b-10, a shunt switch 132b-11, and a capacitor 132b-12, and the transmission amplifier 90b may include a power amplifier 91, at least one capacitor 92, and an inductor 93.

The reception amplifier 110b may be supplied with power source VREG, and the bypass path 115b may be supplied with power source VDD.

Figure 2B:
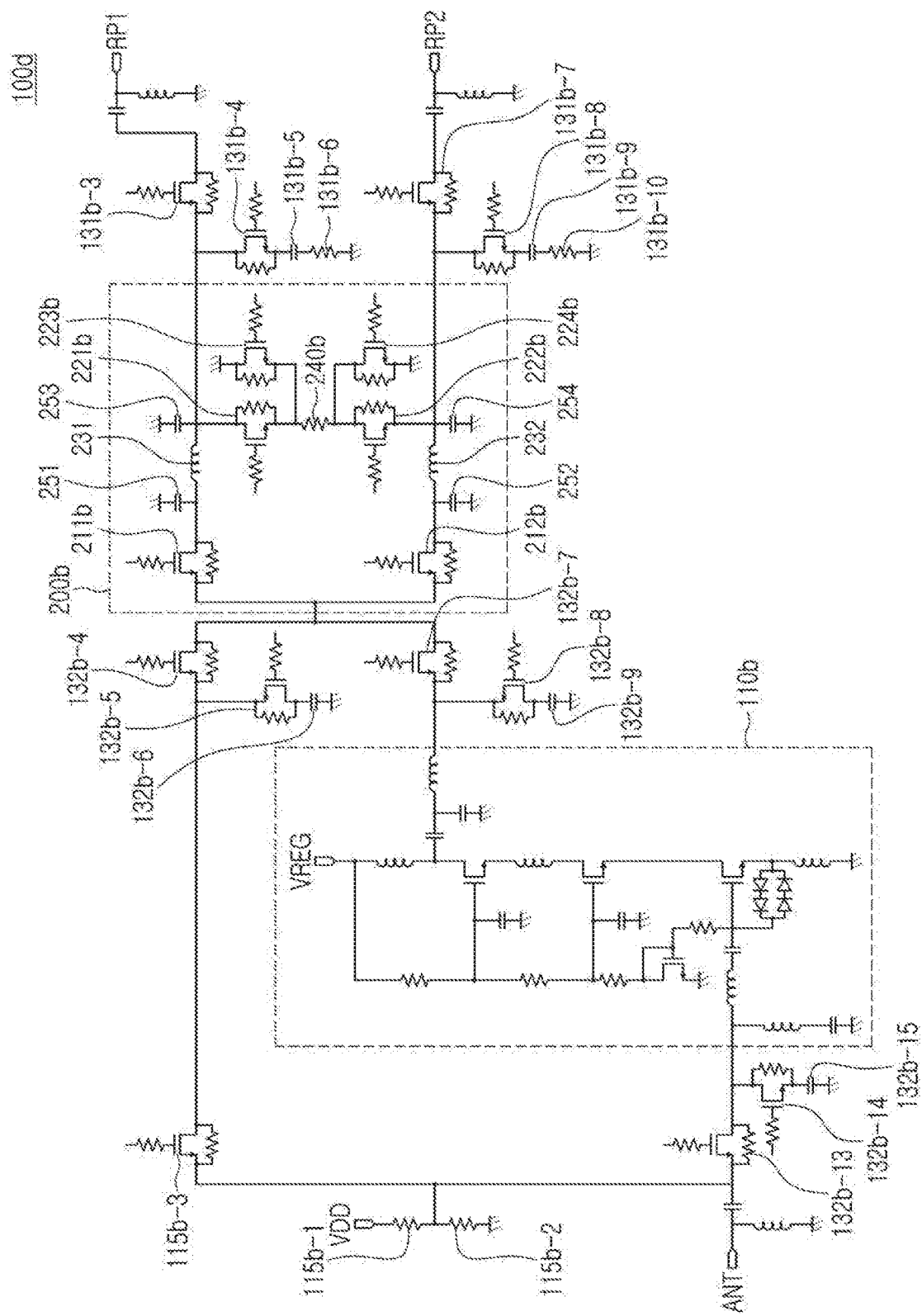
FIG. 2B is a circuit diagram illustrating a structure in which a transmitter is omitted in a radio-frequency (RF) splitter and a front-end module, according to one or more embodiments.

FIG. 2B is a circuit diagram illustrating a structure in which a transmitter is omitted in a radio-frequency (RF) splitter, and a front-end module, in accordance with one or more embodiments.

Referring to FIG. 2B, a radio-frequency splitter 200b of a front-end module 100d according to an example may include first and second series switches 211b and 212b, first, second, third, and fourth shunt switches 221b, 222b, 223b, and 224b, and a resistor 240b.

Each of the first and second series switches 211b and 212b and the first, second, third and fourth shunt switches 221b, 222b, 223b, and 224b may perform switching operations which electrically connect or disconnect a drain terminal and a source terminal of a semiconductor transistor to or from each other, based on a voltage on a gate terminal, may have a structure in which a gate resistor is connected through a gate terminal, and may have a structure in which a drain resistor having a high resistance value is connected between a drain terminal and a source terminal. The drain resistor and/or the gate resistor may be omitted, and the semiconductor transistor may be implemented as a different type of transistor than a field effect transistor. In a non-limiting example, a resistance value of the resistor 240b may be fixed.

For example, each of the first and second series switches 211b and 212b and the first, second, third, and fourth shunt switches 221b, 222b, 223b, and 224b may be implemented as a silicon on insulator (SOI)-based DGNFET having improved frequency characteristics.

The first branch switch may include series switches 131b-3 and 131b-7, shunt switches 131b-4 and 131b-8, capacitors 131b-5 and 131b-9, and resistors 131b-6 and 131b-10.

The second branch switch may include series switch 132b-4, 132b-7, and 132b-13, shunt switches 132b-5, 132b-8, and 132b-14, and capacitors 132b-6, 132b-9, and 132b-15.

A bypass path may include series switches 115b-3 and resistors 115b-1 and 115b-2.

Figure 2C:
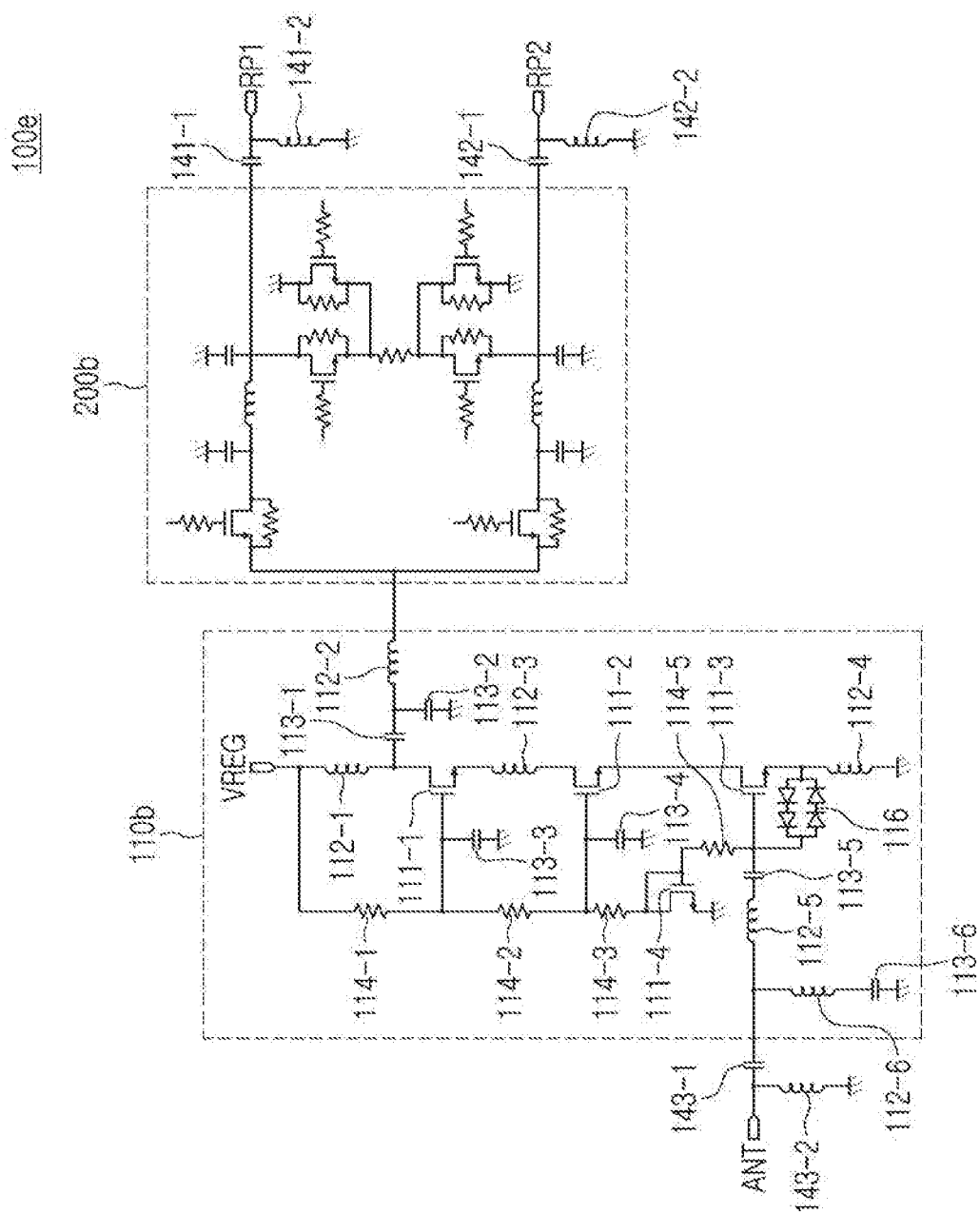
FIG. 2C is a circuit diagram illustrating a structure in which a bypass circuit of a reception amplifier is omitted in a radio-frequency (RF) splitter and a front-end module, according to one or more embodiments.

FIG. 2C is a circuit diagram illustrating a structure in which a bypass circuit of a reception amplifier is omitted in a radio-frequency (RF) splitter and a front-end module, in accordance with one or more embodiments.

Referring to FIG. 2C, a reception amplifier 110b of a front-end module 100e according to an example may include at least a portion of a first amplifier transistor 111-1, a second amplifier transistor 111-2, a third amplifier transistor 111-3, a feedback transistor 111-4, a shunt output inductor 112-1, a series output capacitor 113-1, a shunt output capacitor 113-2, a series output inductor 112-2, an intermediate inductor 112-3, a source inductor 112-4, an input inductor 112-6, gate capacitors 113-3, 113-4, and 113-5, an input capacitor 113-6, gate resistors 114-1, 114-2, 114-3, and 114-5, and a back-to-back diodes 116.

Among the first, second, and third amplifier transistors 111-1, 111-2, and 111-3, at least two amplifier transistors may be combined in a cascode structure. Accordingly, a gain of the reception amplifier 110b may be further increased, and frequency characteristics of the reception amplifier 110b may be further improved.

The intermediate inductor 112-3 may be electrically connected in series between two amplifier transistors, among the first, second, and third amplifier transistors 111-1, 111-2, and 111-3. Accordingly, since the intermediate inductor 112-3 may cancel parasitic capacitances of the first, second, and third amplifier transistors 111-1, 111-2, and 111-3, the intermediate inductor 112-3 may further increase the gain of the reception amplifier 110b and may further widen a bandwidth of the reception amplifier 110b.

The shunt output inductor 112-1 may be electrically connected in series between an output terminal of the first amplifier transistor 111-1 and power source VREG, the series output capacitor 113-1 may be electrically connected in series between an output terminal of the first amplifier transistor 111-1 and the RF splitter 200b, the shunt output capacitor 113-2 may be electrically connected in series between the output terminal of the first amplifier transistor 111-1 and the RF splitter 200b, and a ground output, and the series output inductor 112-2 may be electrically connected in series between the output terminal of the first amplifier transistor 111-1 and the RF splitter 200b.

Accordingly, the reception amplifier 110b may have a wider bandwidth based on a resonant frequency of the output impedance.

The input inductor 112-6 and the input capacitor 113-6 may include a notch filter, and may have a resonant frequency corresponding to a frequency of a second or third harmonic wave of the received RF signal (for example, 2.4 GHz). Accordingly, the input inductor 112-6 and the input capacitor 113-6 may remove the harmonic wave of the received RF signal generated by amplification of the reception amplifier 110b.

The back-to-back diode 116 may stably provide an electrostatic discharge path of the reception amplifier 110b.

A matching terminal of the first reception port RP1 may include a series capacitor 141-1 and a shunt inductor 141-2, a matching terminal of the second reception port RP2 may include a series capacitor 142-1 and a shunt inductor 142-2, a matching terminal of the antenna port ANT may include a series capacitor 143-1 and a shunt inductor 143-2.

Accordingly, since the matching terminal may remove the harmonic wave of the received RF signal generated by amplification of the reception amplifier 110b, and may reduce overall parasitic reactance of the front-end module 100e, insertion loss at a relatively high frequency band (for example, 6 GHz) may be reduced, an overall frequency band of the front-end module 100e may be easily increased, and an overall electrostatic discharge path of the front-end module 100e may be stably secured.

Figure 2D:
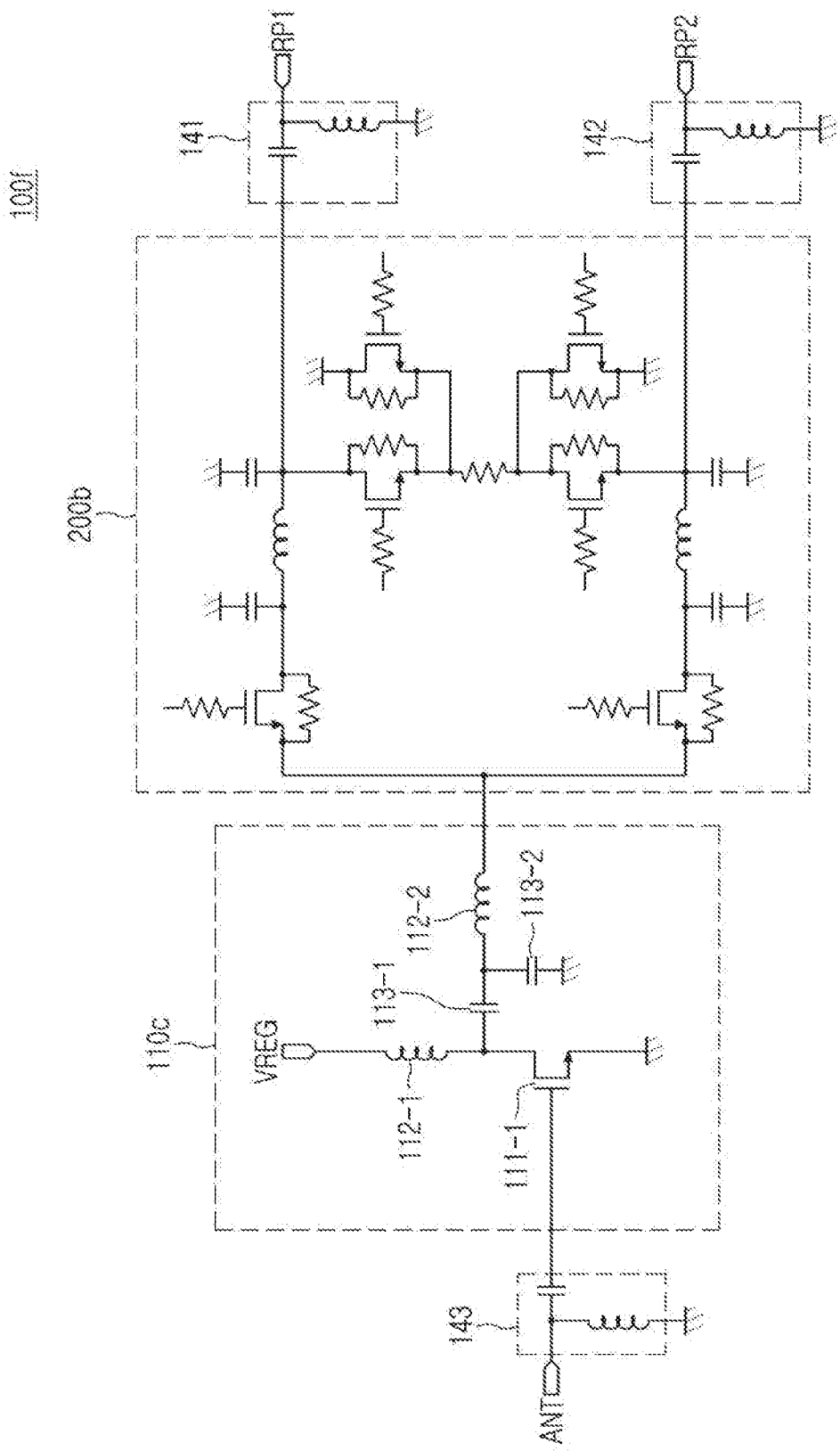
FIG. 2D is a circuit diagram illustrating a simplified structure of a reception amplifier in a radio-frequency (RF) splitter and a front-end module, according to one or more embodiments.

FIG. 2D is a circuit diagram illustrating a simplified structure of a reception amplifier in a radio-frequency (RF) splitter and a front-end module, in accordance with one or more embodiments.

Referring to FIG. 2D, a reception amplifier 110c of a front-end module 100f according to an example may have a structure that is more simplified than the structure of the reception amplifier illustrated in FIG. 2C.

Figure 3A:
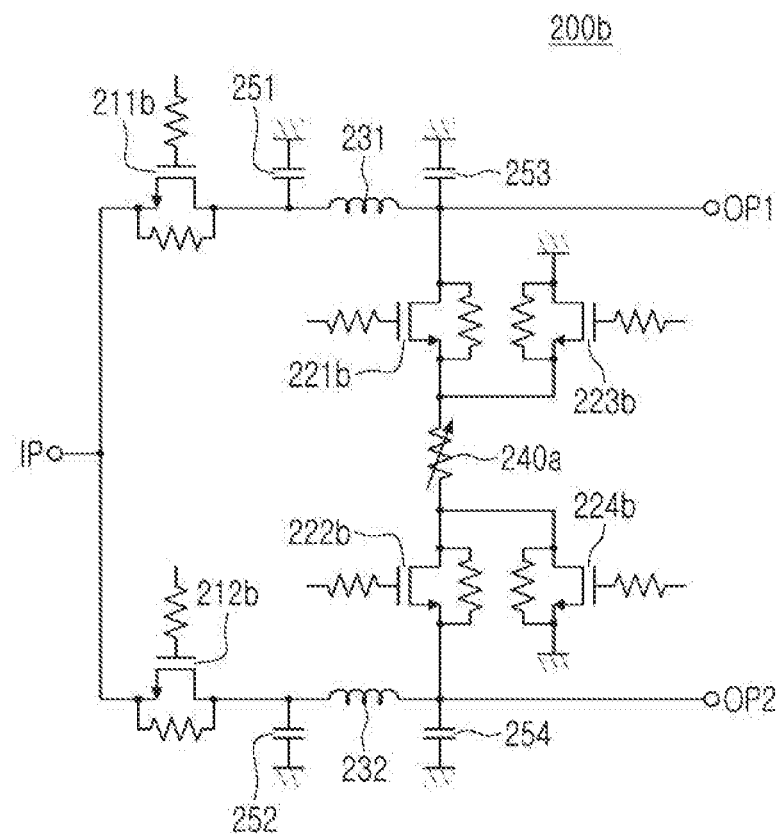
FIG. 3A illustrates a radio-frequency (RF) splitter, according to one or more embodiments.

FIG. 3A illustrates a radio-frequency (RF) splitter, in accordance with one or more embodiments.

Referring to FIG. 3A, a first series switch 211b may control a switching operation which electrically connects or disconnects an input port IP and a first output port OP1 to or from each other, and a second series switch 212b may control a switching operation which electrically connects or disconnects the port IP and a second output port OP2 to or from each other.

Figure 3B:
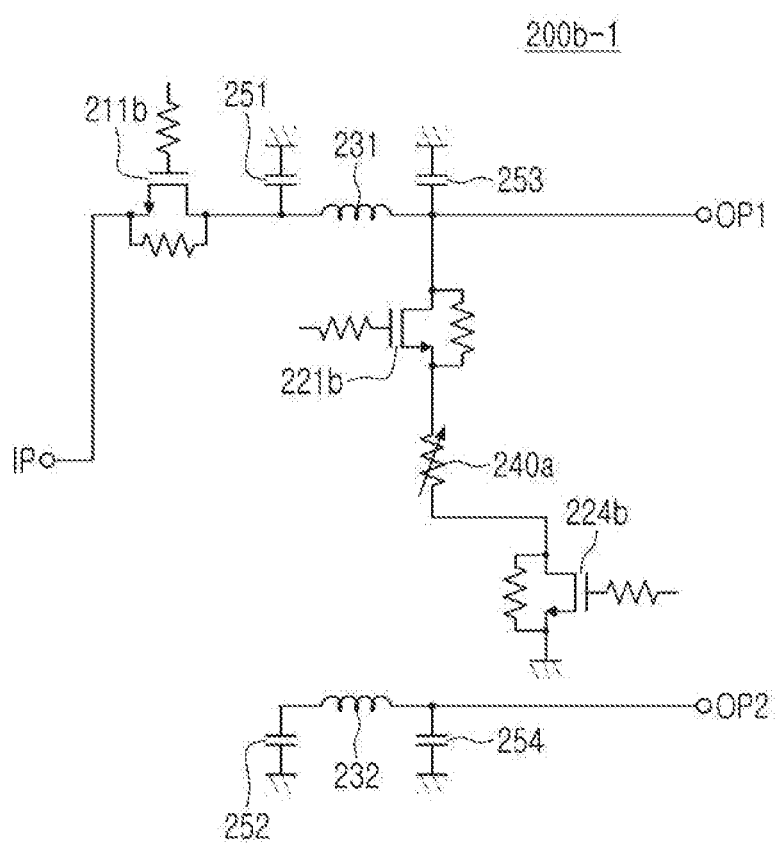
FIG. 3B illustrates a first mode of a radio-frequency (RF) splitter, according to one or more embodiments.

FIG. 3B illustrates a first mode of a radio-frequency (RF) splitter, in accordance with one or more embodiments.

Referring to FIG. 3B, in an RF splitter 200b-1 operating in the first mode, a first series switch 211b, and first and fourth shunt switches 221b and 224b may enter an ON state, and a second series switch and second and third shunt switches may enter an OFF state.

Accordingly, the RF splitter 200b-1 operating in the first mode may electrically connect an input port IP and a first output port OP1 to each other, and may separate the input port IP and a second output port OP2 from each other.

Figure 3C:
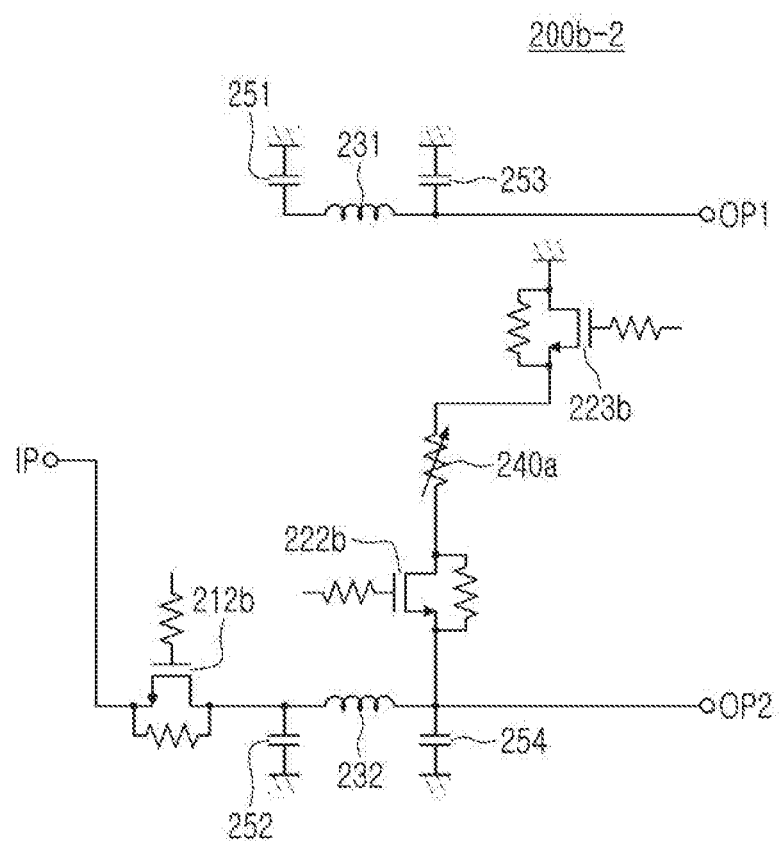
FIG. 3C illustrates a second mode of a radio-frequency (RF) splitter, according to one or more embodiments.

FIG. 3C illustrates a second mode of a radio-frequency (RF) splitter, in accordance with one or more embodiments.

Referring to FIG. 3C, in an RF splitter 200b-2 operating in the second mode, a second series switch 212b and a second and third shunt switches 222b and 223b may enter an ON state, and a first series switch and first and fourth shunt switches may enter an OFF state.

Accordingly, the RF splitter 200b-2 operating in the second mode may electrically connect an input port IP and a second output port OP2 and may separate the input port IP and a first output port OP1 from each other.

Figure 3D:
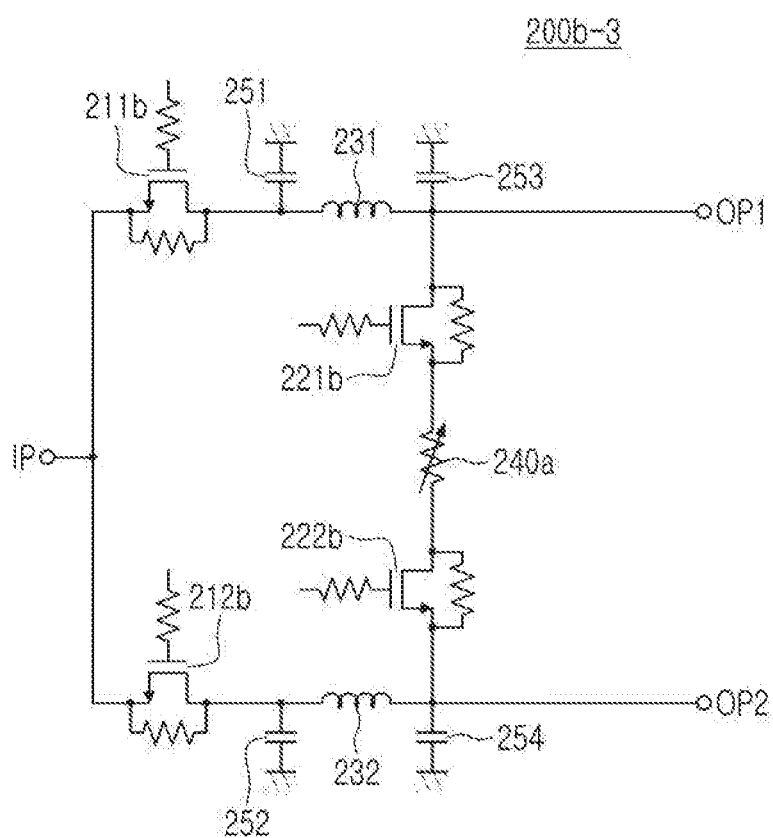
FIG. 3D illustrates a third mode of a radio-frequency (RF) splitter, according to one or more embodiments.

FIG. 3D illustrates a third mode of a radio-frequency (RF) splitter, in accordance with one or more embodiments.

Referring to FIG. 3D, in a RF splitter 200b-3 operating in the third mode, first and second series switches 211b and 212b, and first and second shunt switches 221b and 222b may enter an ON state, and third and fourth shunt switches may enter an OFF state.

Accordingly, the RF splitter 200b-3 operating in the third mode may transfer the RF signal, received through an input port IP, to first and second output ports OP1 and OP2 at the same time.

Figure 3E:
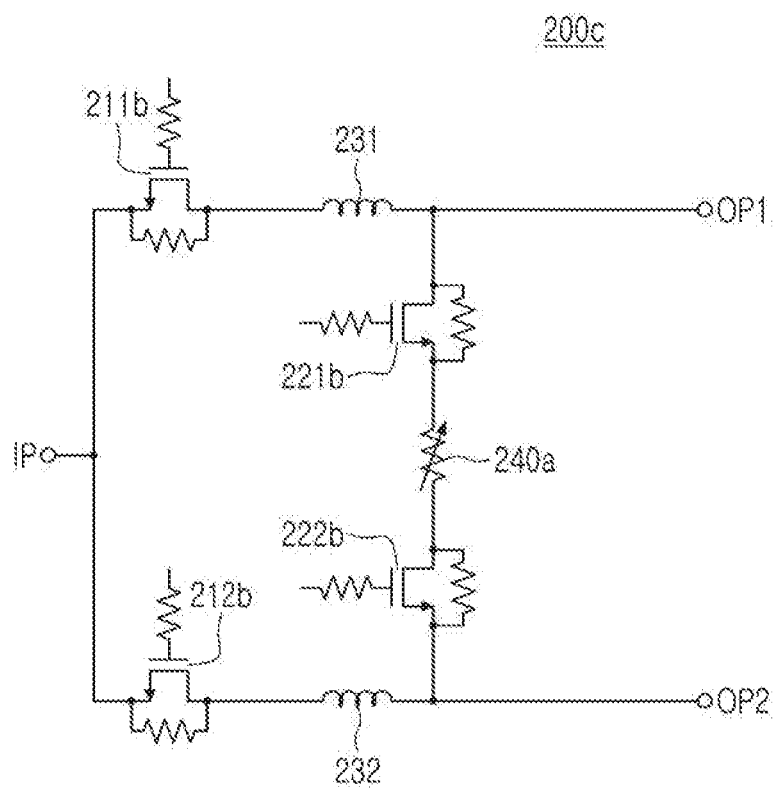
FIG. 3E illustrates a simplified structure of a radio-frequency (RF) splitter, according to one or more embodiments.

FIG. 3E illustrates a simplified structure of a radio-frequency (RF) splitter, in accordance with one or more embodiments.

Referring to FIG. 3E, a radio-frequency (RF) splitter 200c according to an example may have a structure in which the capacitor, illustrated in FIG. 3A, is omitted.

Figure 4:
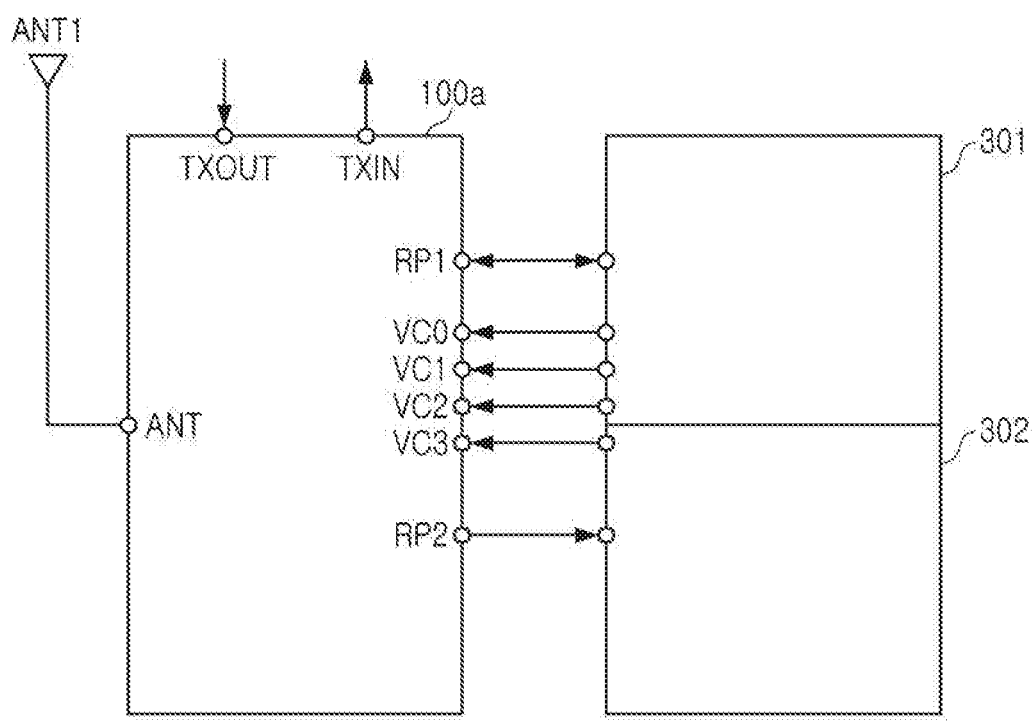
FIG. 4 illustrates a peripheral structure of a front-end module, according to one or more embodiments.

FIG. 4 illustrates a peripheral structure of a front-end module, in accordance with one or more embodiments.

Referring to FIG. 4, a front-end module 100a according to an example may be electrically connected to an antenna ANT1 through an antenna port ANT, may be electrically connected to a first communication modem 301 through a first reception port RP1, and may be electrically connected to a second communication modem 302 through a second reception port RP2.

In an example, the front-end module 100a may be electrically connected to a transmission amplifier through a transmission amplifier input port TXIN and a transmission amplifier output port TXOUT, and may receive mode control voltages VC0, VC1, VC2, and VC3 from first and second communication modems 301 and 302.

The front-end module 100a, the first and second communication modems 301 and 302, and the antenna ANT1 may be disposed in an electronic device. The electronic device may be a smartphone, a personal digital assistant, a digital video camera, a digital still camera, a network system, a computer, a monitor, a tablet computer, a laptop computer, a netbook computer, a television, a video game console, a smartwatch, an automotive, or the like, but is not limited thereto.

An RF signal disclosed therein may have a form based on a protocol such as wireless fidelity (Wi-Fi) (Institute of Electrical And Electronics Engineers (IEEE) 802.11 family, or the like), worldwide interoperability for microwave access (WMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, any other wireless and wired protocols designated after the abovementioned protocols, or the like, but the form of the RF signal is not limited thereto.

As described above, a radio-frequency (RF) splitter and a front-end module according to an example may support effective and stable reception of a received RF signal in both a first case, in which first and second communication modems operate at the same time, and a second case in which first and second communication modems operate in a time division duplexing manner, and may prevent performance deterioration resulting from a reflected wave of the received RF signal.

In addition, a radio-frequency (RF) splitter and a front-end module according to an example may have a higher frequency band and a wider bandwidth.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A radio-frequency (RF) splitter comprising:
   a common branch node configured to transfer an RF signal, input from an input port, to at least one of a first output port and a second output port;
   a first branch node electrically connected between the common branch node and the first output port;
   a second branch node electrically connected between the common branch node and the second output port, and electrically connected to the first branch node;
   a first series switch configured to control a switching operation to electrically connect the common branch node and the first branch node to each other;
   a second series switch configured to control a switching operation to electrically connect the common branch node and the second branch node to each other;
   a first inductor electrically connected between the common branch node and the first branch node;
   a second inductor electrically connected between the common branch node and the second branch node;
   a resistor electrically connected between the first branch node and the second branch node;
   a first shunt switch configured to control a switching operation to electrically connect the first branch node and the resistor to each other; and
   a second shunt switch configured to control a switching operation to electrically connect the second branch node and the resistor to each other.

2. The RF splitter of claim 1, wherein the first series switch and the first shunt switch are configured to operate in an ON state when the RF splitter operates in a first mode and a third mode, and are configured to operate in an OFF state when the RF splitter operates in a second mode, and
   the second series switch and the second shunt switch are configured to operate in an ON state when the RF splitter operates in the second mode and the third mode, and are configured to operate in an OFF state when the RF splitter operates in the first mode.

3. The RF splitter of claim 1, further comprising:
   a third shunt switch configured to control a switching operation to electrically connect a ground and a third branch node between the first branch node and the resistor to each other; and
   a fourth shunt switch configured to control a switching operation to electrically connect the ground and a fourth branch node between the second branch node and the resistor to each other.

4. The RF splitter of claim 3, further comprising:
   a first capacitor electrically connected between a first end of the first inductor and the ground;
   a second capacitor electrically connected between a first end of the second inductor and the ground;
   a third capacitor electrically connected between a second end of the first inductor and the ground; and
   a fourth capacitor electrically connected between a second end of the second inductor and the ground.

5. The RF splitter of claim 4, wherein the first capacitor, the second capacitor, the third capacitor, and the fourth capacitor, and the first inductor and the second inductor have impedance such that the RF signal of a fundamental frequency of a band of 5.1 GHz to 7.2 GHz, is transferred to at least one of the first output port and the second output port.

6. The RF splitter of claim 1, further comprising:
   a first capacitor electrically connected between the first inductor and a ground; and
   a second capacitor electrically connected between the second inductor and the ground,
   wherein the first inductor is connected in series between the common branch node and the first branch node, and the second inductor is connected in series between the common branch node and the second branch node.

7. The RF splitter of claim 1, wherein the resistor has a first resistance value when the RF splitter transfers the RF signal to only one of the first output port and the second output port, and has a second resistance value, different from the first resistance value, when the RF splitter transfers the RF signal to the first output port and the second output port.

8. A front-end module comprising:
a reception amplifier configured to amplify a received radio-frequency (RF) signal; and
an RF splitter electrically connected between an output terminal of the reception amplifier and first and second reception ports,
wherein the RF splitter comprises:
a common branch node configured to transfer one of a first RF signal of the received RF signal amplified by the reception amplifier, and a second RF signal of the received RF signal that bypasses the reception amplifier, to at least one of the first reception port and the second reception port;
a first branch node electrically connected between the common branch node and the first reception port;
a second branch node electrically connected between the common branch node and the second reception port, and electrically connected to the first branch node;
a first series switch configured to control a switching operation to electrically connect the common branch node and the first branch node to each other;
a second series switch configured to control a switching operation to electrically connect the common branch node and the second branch node to each other;
a first inductor electrically connected between the common branch node and the first branch node;
a second inductor electrically connected between the common branch node and the second branch node;
a resistor electrically connected between the first branch node and the second branch node;
a first shunt switch configured to control a switching operation to electrically connect the first branch node and the resistor to each other; and
a second shunt switch configured to control a switching operation to electrically connect the second branch node and the resistor to each other.

9. The front-end module of claim 8, further comprising:
a third shunt switch configured to control a switching operation to electrically connect a ground and a third branch node between the first branch node and the resistor to each other; and
a fourth shunt switch configured to control a switching operation to electrically connect a ground and a fourth branch node between the second branch node and the resistor to each other.

10. The front-end module of claim 9, further comprising:
a controller configured to operate in a selected one of a first mode, a second mode, and a third mode to control the first series switch and the second series switch, and the first shunt switch, the second shunt switch, the third shunt switch, and the fourth shunt switch,
wherein the controller, when configured to operate in the first mode, controls the first series switch and the first and fourth shunt switches in an ON state, and controls the second series switch and the second and third shunt switches in an OFF state,
the controller, when configured to operate in the second mode, controls the second series switch and the second and third shunt switches in an ON state, and controls the first series switch and the first and fourth shunt switches in an OFF state, and the controller, when configured to operate in the third mode, controls the first and second series switches and the first and second shunt switches in an ON state and controls the third and fourth shunt switches in an OFF state.

11. The front-end module of claim 10, wherein the resistor has a selected one of a first resistance value and a second resistance value, wherein the first resistance value is different from the second resistance value, and
the controller is configured to control the resistor such that the resistor has the first resistance value when the controller operates in the first mode and the second mode, and has the second resistance value when the controller operates in the third mode.

12. The front-end module of claim 10, wherein the RF splitter transfers the first RF signal, which is of a first communication protocol, to the first reception port when the controller operates in the first mode and transfers the second RF signal, which is of a second communication protocol, different from the first communication protocol, to the second reception port when the controller operates in the second mode, and
at least a portion of a frequency band of the first communication protocol, and at least a portion of a frequency band of the second communication protocol overlap each other.

13. The front-end module of claim 8, further comprising:
a first branch switch electrically connected between the first reception port and the first branch node; and
a second branch switch electrically connected between an input terminal of the reception amplifier and an antenna port,
wherein the first branch switch and the second branch switch are configured to transfer the received RF signal from the antenna port to the first reception port or the second reception port through the RF splitter when the first branch switch and the second branch switch operate in a receiving mode, and to transfer the received RF signal from the first reception port to the antenna port by bypassing the RF splitter when the first branch switch and the second branch switch operate in a transmitting mode.

14. The front-end module of claim 13, further comprising:
a transmission amplifier input port configured to be electrically connected to the first branch switch, and to be electrically connected to an input terminal of an external transmission amplifier; and
a transmission amplifier output port configured to be electrically connected to the second branch switch, and to be electrically connected to an output terminal of the transmission amplifier.

15. The front-end module of claim 8, wherein the reception amplifier comprises:
a first amplifier transistor and a second amplifier transistor connected in a cascode structure; and
an intermediate inductor electrically connected in series between the first amplifier transistor and second amplifier transistor.

16. The front-end module of claim 8, wherein the reception amplifier comprises:
a shunt output inductor electrically connected in series between an output terminal of a first amplifier transistor and a power source;
a series output capacitor electrically connected in series between the output terminal of the first amplifier transistor and the RF splitter;

a shunt output capacitor electrically connected in series between the output terminal of the first amplifier transistor and the RF splitter, and a ground; and a series output inductor electrically connected in series between the output terminal of the first amplifier transistor and the RF splitter.

\* \* \* \* \*